United States Patent
Huang et al.

(10) Patent No.: US 11,106,107 B2
(45) Date of Patent: Aug. 31, 2021

(54) ULTRA-FLEXIBLE AND ROBUST SILVER NANOWIRE FILMS FOR CONTROLLING LIGHT TRANSMISSION AND METHOD OF MAKING THE SAME

(71) Applicant: 1-Material Inc, Dorval (CA)

(72) Inventors: Shengyun Huang, Varennes (CA); Fuqiang Ren, Varennes (CA); Dongling Ma, Varennes (CA); Shiyong Zhao, Longueuil (CA); Dawei Zhang, Lachine (CA); Yanan Li, Montreal (CA); Shuyong Xiao, St-Laurent (CA)

(73) Assignee: ZHEJIANG JINGYI NEW MATERIAL TECHNOLOGY CO., LTD, Zhejiang (CN)

( * ) Notice: Subject to any disclaimer, the term of this patent is extended or adjusted under 35 U.S.C. 154(b) by 214 days.

(21) Appl. No.: 16/125,716

(22) Filed: Sep. 9, 2018

(65) Prior Publication Data

US 2020/0081312 A1    Mar. 12, 2020

(51) Int. Cl.
*G02F 1/17* (2019.01)
*H01B 1/22* (2006.01)

(52) U.S. Cl.
CPC ............... *G02F 1/172* (2013.01); *H01B 1/22* (2013.01); *G02F 2202/36* (2013.01)

(58) Field of Classification Search
CPC ............. G02F 1/167; G02F 2001/1678; G02F 1/1676; G02F 1/1681; G02F 1/13306; G02F 2202/28; G02F 1/172; G02F 1/133305; G02F 1/1368; G02F 1/133514; G02F 2202/36; G02F 2203/34; G02F 1/0121; G02F 1/133308; G02F 1/133516; G02F 1/1339; G02F 2001/133311; G02F 2202/022; G02F 1/133345; G02F 1/13338; G09G 3/344; G09G 3/2003; G09G 3/3446; G09G 3/34; G09G 2300/0426; G09G 2310/068; G09G 3/3406; G09G 2300/0452; G09G 2300/08; G09G 2310/0262; G09G 2310/0267; G09G 2310/0272; G09G 2310/0275; G09G 2310/06; G09G 2310/08; G09G 2320/0238; G09G 2320/0242; G09G 2320/066; G09G 2320/0666; G09G 2330/027; G02B 26/026; G02B 5/201; G02B 1/14; G02B 6/005; G02B 2027/0118; G02B 26/004; G02B 26/005; G02B 27/0172; G02B 1/04; G02B 1/10; G02B 1/11; G02B 1/18; G02B 2027/0178; G02B 26/00; G02B 26/007; G02B 26/02;
(Continued)

(56) References Cited

U.S. PATENT DOCUMENTS

| 4,164,365 A * | 8/1979 | Saxe ..................... G02F 1/172 359/296 |
| 6,900,923 B2 * | 5/2005 | Chakrapani ............ G02F 1/172 359/296 |

(Continued)

*Primary Examiner* — William R Alexander
*Assistant Examiner* — Sharrief I Broome
(74) *Attorney, Agent, or Firm* — Yue (Robert) Xu; Apex Attorneys at Law, LLP (57) ABSTRACT

The invention provides a mechanically flexible, electrically conductive, and optically transparent silver nanowire film and demonstrates its specific application in light transmission controlling devices.

18 Claims, 5 Drawing Sheets

(58) Field of Classification Search
CPC ............ G02B 27/0101; G02B 27/0176; G02B 3/0037; G02B 3/0056
See application file for complete search history.

(56) References Cited

U.S. PATENT DOCUMENTS

| | | | |
|---|---|---|---|
| 2007/0074316 A1* | 3/2007 | Alden .................... | B82Y 30/00 257/784 |
| 2013/0105770 A1* | 5/2013 | Pschenitzka ........ | H01L 31/1884 257/40 |
| 2014/0239221 A1* | 8/2014 | Harrison ................ | C01B 33/26 252/67 |
| 2015/0017386 A1* | 1/2015 | Kolb ...................... | G02B 1/118 428/149 |
| 2015/0104936 A1* | 4/2015 | Markovich .............. | H01B 1/02 438/610 |
| 2017/0154698 A1* | 6/2017 | Kim ........................ | H01B 1/02 |
| 2020/0125198 A1* | 4/2020 | Du .......................... | G06F 3/047 |

* cited by examiner

ULTRA-FLEXIBLE AND ROBUST SILVER NANOWIRE FILMS FOR CONTROLLING LIGHT TRANSMISSION AND METHOD OF MAKING THE SAME

TECHNICAL FIELD

The present invention generally relates to the field of transparent conductive electrodes, which are key components in optoelectronic devices, such as solar cells, touch panels, flat displays and smart windows. In particular, the invention is directed to a method for producing optically transparent and electrically conductive silver nanowire films with excellent flexibility and robust adhesion, and to the use of said films as flexible and transparent conductive electrodes in transmission controlling devices, more specifically in suspended particle devices.

BACKGROUND ART

Recently, electronic and optoelectronic devices impact more and more areas of the society, from simple household appliances and multimedia systems to communications, energy, and medical instruments. Transparent conductive electrode (TCE) is a key part of these optoelectronic devices, such as solar cells, flat displays, touch panels, and smart windows. Indium tin oxide (ITO) is the most commonly used materials for the fabrication of TCEs due to high transmittance and good electrical conductivity. However, it is not suitable for the use in flexible electronic devices because ITO is brittle and can easily crack when used in applications where bending cannot be absolutely avoided. Therefore, electrodes with transparent, flexible and wearable features, have attracted broad attentions, aiming at replacing traditionally ITO electrodes. As such, various types of materials, such as carbon nanotubes (CNTs), graphene, conductive polymers, metal meshes, and metal nanowires have been explored and considered as potentially useful candidates for next generation flexible TCEs. Among them, silver nanowire (Ag NW)-based TCEs have garnered great interest due to their high optical transmittance and low sheet resistance. In general, the essence of preparing a flexible Ag NW-based TCE is based on traditional film deposition techniques, such as vacuum filtration, spin coating, rod coating, photolithography, and spray coating, to deposit a conductive Ag NW layer onto a nonconductive transparent flexible substrate, normally a polyethylene terephthalate (PET) substrate. Although substantial progresses have been made in recent years, many limitations still severely restrict their application. First, the electrical conductivity of the Ag NW films is poor because of high contact resistance between NWs. The common strategies involving mechanical pressing, thermal treatment, and plasmonic welding, however, can lead to damage to the substrates and are not suitable for flexible device applications. Second, the oxidation and high surface roughness of the Ag NW films also need urgent attention. Last but not least, continuous large-scale preparation of uniform and flexible Ag NW-based TCEs with high quality is still a big challenge.

Accordingly, the present invention has been made keeping in mind the above problems in prior art and an objective of the present invention is to provide a facile and large-scale NWs assembly strategy for the fabrication of ultra-flexible and robust Ag NW-based TCEs with high optical transmittance, good electrical conductivity and low surface roughness. The invention also encompasses a flexible light transmission controlling device fabricated based on the flexible Ag NW TCE. The light transmission controlling devices, also called light valves (LV), such as smart windows in particular, are increasingly demanded by market to replace the traditional window shades or blinds for comfortable living and energy saving. Currently, three main technologies are explored in these devices, referred as liquid crystal display (LCD), electrochromic device (ECD) and suspended particles device (SPD). All these three technologies require transparent electrodes in both sides of the device, and the cost of transparent electrodes is becoming an economical road block for large area implementation. Among these technologies, SPDs, such as those described in US patents US20100014150 and US20100047593, composed of elongated rod-like particles suspended in a medium that is sandwiched in between two TCEs represent one of the most promising systems for smart window application. Specifically, in SPDs electrodes are used to create an electromagnetic field, and electric current does not need to flow through from one electrode to the other. Therefore it is preferred to have TCEs with high optical transparency, but, unnecessarily, high electric conductivity. Therefore, a potentially economic TCE with relatively lower electric conductivity (than traditionally ITO electrodes), such as flexible Ag NW film to be disclosed in this patent application, is practically applicable for SPD application. As further disclosed in the patent application, the Ag NW film developed herein has a very high light transmittance up to 95% and a square resistance of about 400 Ω/sq, which makes it a potentially economic and preferable candidate for SPD devices.

It is now the objective of the present invention to provide an electrically conductive, optically transparent and mechanically flexible Ag NW film and the method to make such a film.

It is now also the objective of the present invention to provide a method to assemble a light transmission controlling device using the electrically conductive, optically transparent and mechanically flexible Ag NW film as TCE provided in this invention.

SUMMARY OF THE INVENTION

The present invention provides an electrically conductive and optically transparent Ag NW film with excellent flexibility and superior mechanical stability and the method to make such a film.

The present invention also provides a method to assemble a light transmission controlling device using the electrically conductive, optically transparent and mechanically flexible Ag NW film as TCE provided in this invention.

BRIEF DESCRIPTION OF THE DRAWINGS

FIG. 1 presents a schematic illustration of the preparation process of ultra-flexible Ag NW-based TCE. Briefly, the glass substrate (000) was first cleaned by ultrasonic treatment in acetone, ethyl alcohol, deionized water and isopropanol sequentially and dried by using nitrogen gas. Then, the Ag NW layer (200) was deposited onto the glass substrate (000) by blade coating using Ag NW ink. The Ag NW ink was prepared by dispersing Ag NWs in an alcohol (e.g., methanol, ethanol, or isopropanol) or acetone, with the help of stabilizers. The thickness of the Ag NW layer (200) can be varied by changing the concentration of the Ag NW ink and the gap between the blade and the substrate surface. After drying in an oven, a layer of polymer (100) was deposited onto the Ag NW layer. The glass substrate/Ag NW film/polymer was then cured. Finally, the free-standing, ultra-flexible Ag NW-based TCE can be obtained by peeling off the Ag NW/polymer film from the glass substrate.

FIG. 10 presents optical photographs of the light controlling device bended at 180° when the voltage of 110 V is switched off and on.

FIG. 11 demonstrates the concept of a three-dimensional light controlling device, enabled herein by the use of the Ag NW TCE, by attaching it onto the surface of a beaker when the voltage of 110 V is switched off and on.

DETAILED DESCRIPTION OF THE INVENTION

The present invention provides an electrically conductive, optically transparent and mechanically flexible Ag NW films and the method to make such a film. It also provides a method to assemble light transmission controlling devices using the electrically conductive, optically transparent and mechanically flexible Ag NW films provide in this invention. The developed ultra-flexible TCE not only presents attractive features in SPD, but also holds high promise for applications in solar cells, light emitting diodes (LEDs), touch panels and flat displays. In this invention, the developed TCE for a particular light controlling device, more specifically SPD has been disclosed.

Figure 1:
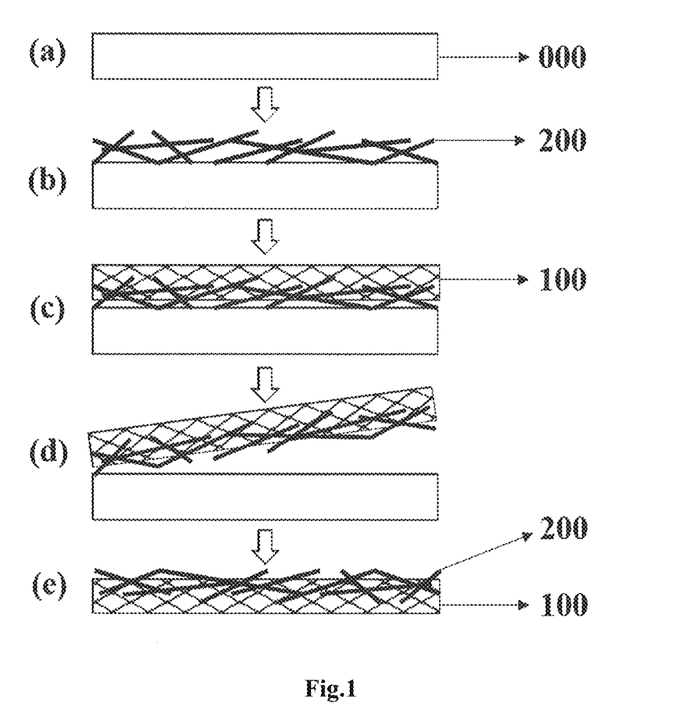
Figure 2:
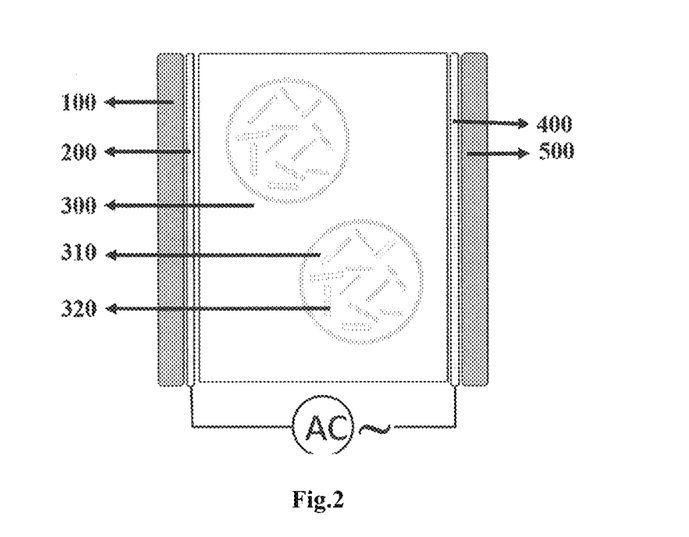
FIG. 2 schematically presents the light controlling device, wherein, 100 is a flexible and transparent substrate, 200 is layer of Ag NW film, 300 is an active layer of polymeric matrix containing droplets (310) and suspended particles (320), 400 is another layer of Ag NW film, and 500 is another flexible and transparent substrate.

FIG. 2 schematically illustrates a light controlling device, specifically a SPD, wherein, 100 is a flexible and transparent substrate, 200 is layer of Ag NW film developed in this invention, 300 is layer of polymeric matrix containing suspended particle (320) in droplets (310), 400 is another layer of Ag NW film developed in this invention, and 500 is another flexible and transparent substrate.

According to this invention as illustrated in FIG. 2, both the Ag NW film 200 and Ag NW film 400 are preferably to be the same in order to have similar optical effect at the both sides of the polymeric matrix layer which contains droplets (310) and suspended particles (320), so the light can be controlled in a symmetric manner, eventually help to reduce the haze effect of the device.

In this invention, the Ag NWs were first synthesized by a wet chemistry method by modifying a previously reported procedure. Compared to previous work, we have scaled up the reaction by 200 times by increasing the concentration of reactants. According to this invention, Ag NW ink was achieved by dispersing Ag NWs in deionized water, methyl alcohol, ethyl alcohol, isopropanol (IPA), butyl alcohol, acetone, ethylene glycol, or a mixture of any two and more materials as listed. The concentration of Ag NWs in suspension was adjusted to get a stable suspension for next-step Ag NW film formation. Therefore, the concentration of Ag NWs in suspension requires careful optimization and prefers to be in the range of 0.01 mg/ml to 20 mg/ml, and mostly prefers to be in the range of 1 mg/ml to 8 mg/ml. According to this invention, the Ag NW films can be obtained by vacuum filtration, transfer printing, spin coating, spray coating, blade coating and droplet coating, and other film formation techniques.

In this invention, a blade coating technique is further disclosed to obtain a large area Ag NW film on rigid substrates, for example, glass. By varying the gap between the blade and substrate or the concentration of Ag NWs in suspension, the thickness of the films can be tuned, therefore different transparencies and varied sheet resistance can be obtained. In order to increase the electrical conductivity of the as-prepared Ag NW film, intimate contact junctions between NWs should be created by thermal annealing, salt treatment or flash-induced self-limited plasmonic welding.

In this invention, the ultra-flexible Ag NW TCE can be prepared using blade coating, spin coating, spray coating, droplet coating, and other film fabrication techniques followed by the deposition of a thin layer of transparent polymer. The said thin layer polymer can be made of the same material or different materials, which light can be transmitted through, preferably having a light transmittance equal to or greater than 80%, more preferably 90%. The said thin layer of transparent polymer is selected in such a way that it is transparent ultra-flexible and chemically stable, and has a good adhesion with Ag NWs, allowing for the facile, physical embedment of the Ag NWs. According to this invention, the preferable transparent polymers include poly methacrylate (PMA), polyethylene (PE), polyethylene terephthalate (PET), polymethyl methacrylate (PMMA), urethane, polyethylene naphthalate (PEN), polyvinyl alcohol (PVA) and polycarbonate (PC). More preferably, the highly transparent ones are selected from urethane, PVA and PMMA.

The Ag NWs embedded in a transparent polymer were subsequently peeled off from the glass substrate. The thickness of transparent polymer was adjusted and optimized for balancing the flexibility and mechanical and optical properties of the TCE. The above variables were systematically screened and, hence a suitable transparent polymer thickness is preferably between 1-150 μm, more preferably, 10-80 μm.

As illustrated in FIG. 2, the said active layer 300 is preferably a high transmittance polymeric matrix (PM) material. More preferably, the said PM 300 can be formed by photo-curing, so the shrinkage of this layer can be technically controlled. Still more preferably, the said polymeric matrix layer 300 is a cross-linked polysiloxane formed from liquid siloxane copolymer with ethylenically unsaturated bond by photo-curing method described in US patents U.S. Pat. Nos. 7,791,788 and 6,900,923. Hereinafter, the photo-curable polysiloxane which is used to form the PM layer 300 is referred as PM. The optical transmittance can be varied by changing the thickness of the layer 300, and such a thickness is preferably between 5-300 μm, more preferably, 40-150 μm.

As illustrated in FIG. 2, the said PM layer 300 encloses many droplets (310) and each droplet (310) encapsulates multiple particles (320), and these particles (320) are capable of re-orientation in an electronic field. Hereinafter, the droplet material (310) is also referred to as the suspension media (SM) and the particle is also referred to as light polarized particle (LPP) for scientific proposal.

According to this invention as illustrated in FIG. 2, the material of SM forming droplet (310) should be different from the PM material, and should be kept in a liquid form or at least a gel form within the PM. If the PM is an acrylate, the said SM is preferably selected from TDTM (Tri-Isodecyl Trimellitate) or silicone oil, or a mixture of any two and more materials as listed in US patents U.S. Pat. Nos. 6,900,923 and 7,791,788.

According to this invention as illustrated in FIG. 2, the said LPPs (320) which are encapsulated inside the said droplet (310) should be rod-like or needle-like particles, and can be polarized and rotated to align themselves with the electric field. Both the chemical nature and geometric dimension of the LPP need to be scientifically optimized. The chemical composition of the said LPP can comprise any suitable materials from silver, titanium dioxide ($TiO_2$), herapathite, and polyhalides. More preferably, LPP is made of calcium polyhalide, as listed in US patent U.S. Pat. No. 8,520,294. The geometric dimensions of optimized LPP nanorods are preferably to be about 50-800 nm in length, more preferably 200-300 nm, and 10-90 nm in diameter, more preferably 30-50 nm.

According to the present invention, the said PM (300) material, SM (310) material and LPP (320) are formulated into an emulsion, hereinafter referred to as SPD emulsion. The film prepared by this SPD emulsion can be sandwiched between two flexible Ag NW layers 200 and 400. Other additives including emulsifier and stabilizer can also be added into this formulated SPD emulsion.

In one embodiment, the layer 100 and the layer 500 are PVA films. The Ag NW film 200 and the Ag NW film 400 were first formed on the PVA film 100 and 500 to have two flexible TCEs, 200/100 and 400/500. The formulated SPD emulsion was then deposited onto one flexible TCE by spray coating, and subsequently covered by another flexible TCE. The thickness of PM layer can be controlled by varying the volume of PM or the cycles of spray coating. Such an assembly was then exposed to UV-radiation to cure the emulsion and form the layer 300 between the layer 200 and the layer 400, ultimately a light controlling device as illustrated in FIG. 2 is completed.

In another embodiment, the layer 100 and the layer 500 are urethane material. The Ag NW film 200 and the Ag NW film 400 were first embedded into 100 and 500 to have two flexible TCEs, 200/100 and 400/500. The formulated SPD emulsion was first applied onto one TCE 200/100 by doctor blade method to achieve a thickness of about 80 µm, then was exposed to UV-radiation to cure the emulsion and form the layer 300 on top of the film of 200/100, finally another flexible TCE film 400/100 was placed on the top of the layer 300 to complete the assembly of a light controlling device as illustrated in FIG. 2.

EXAMPLES

The invention will now be described in more detail with reference to the following examples. However, it should be understood that these examples are given for the purpose of illustration only and are not intended to limit the scope of the present invention.

Example 1

Figure 3:
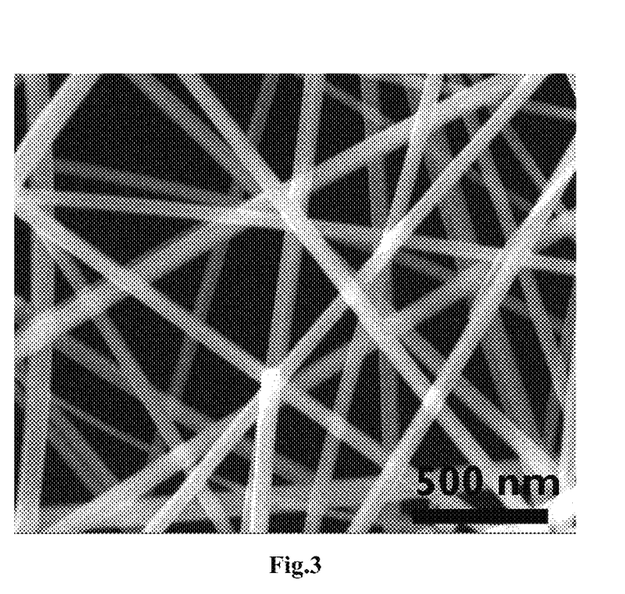
FIG. 3 presents the morphology of the as-prepared Ag NWs.

In this example, Ag NWs were synthesized by reducing $AgNO_3$ with ethylene glycol (EG) containing trace amounts of NaCl and $Fe(NO_3)_3$, following the approach developed by Lim and co-workers. Compared to this previous work, we have scaled up the reaction by 200 times to demonstrate its potential for large-scale production. The morphologies of the synthesized NWs were examined using a scanning electron microscope (SEM), as shown in FIG. 3. The average diameter of synthesized Ag NWs is around 50 nm.

Example 2

Figure 4:
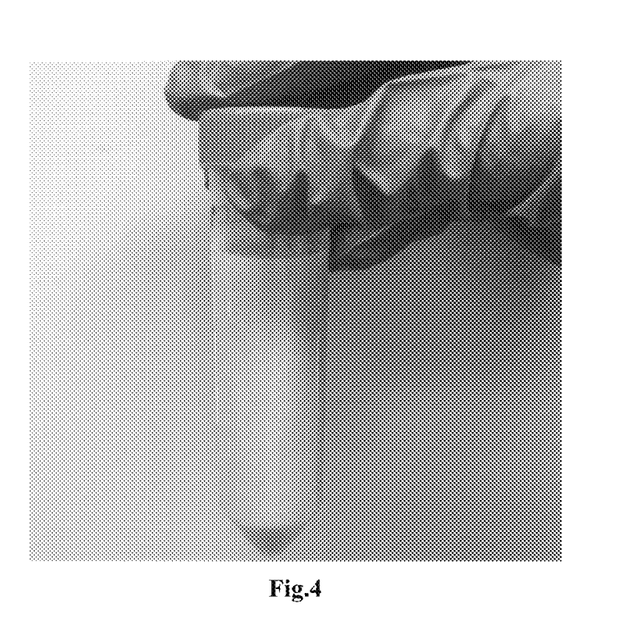
FIG. 4 presents an optical image of a stable dispersion of Ag NWs in isopropanol.

In this example, the Ag NW ink was obtained by dispersing the Ag NWs in IPA. The concentration of the Ag NWs in the dispersion was around 10 mg/ml, as shown in FIG. 4. To evaluate the stability of the Ag NW ink, it was then kept at room temperature for 10 days, 20 days and 30 days and closely monitored. It was found that some of Ag NWs were precipitate in all these cases, but after vibration for a few seconds, the NWs can be easily re-dispersed uniformly in IPA.

Example 3

Figure 5:
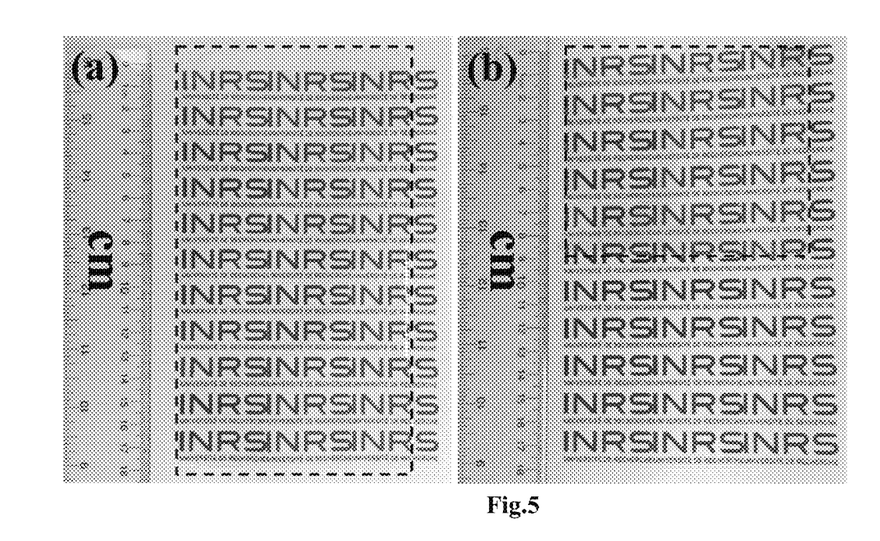
FIG. 5 presents optical photographs of a large-area and flexible Ag NW TCE before and after being bended by 180°.
Figure 6:
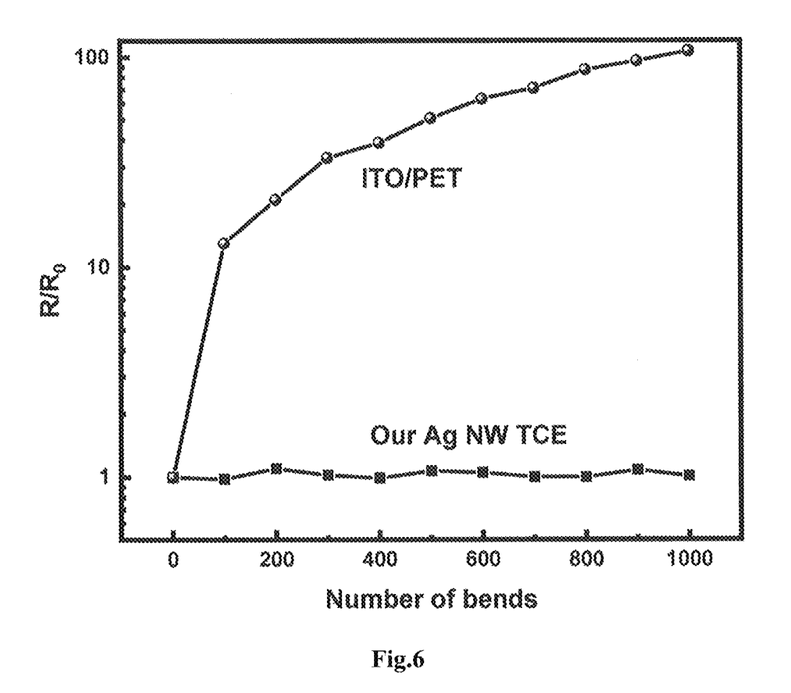
FIG. 6 presents increase in sheet resistance versus the number of bends for the flexible Ag NW TCE and a commercially available ITO-PET.
Figure 7:
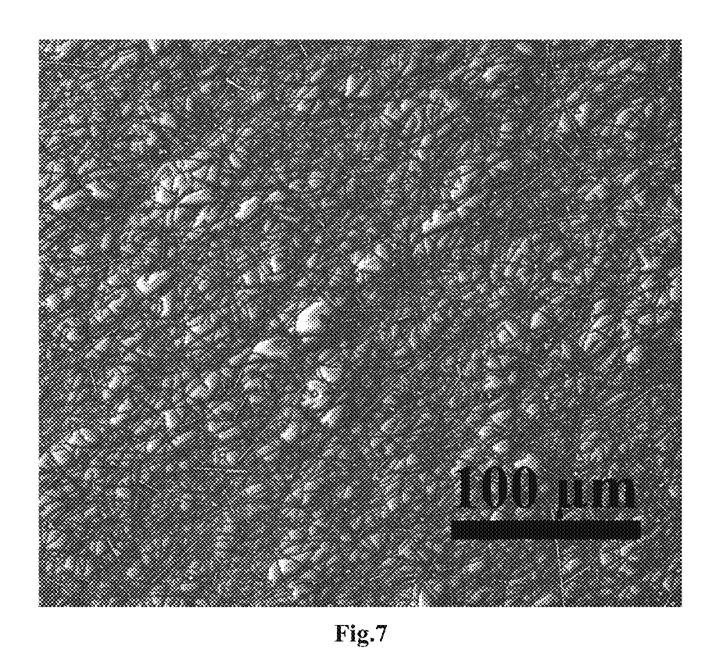
FIG. 7 presents the morphology of flexible Ag NW-based TCE.

Following the procedures described in Example 1 and Example 2, the large area and flexible Ag NW-based TCEs were prepared by blade coating with different thickness and transmittance by varying the concentration of Ag NWs in ink and the blade coating parameters. Prior to coating, the glass substrate was cleaned by ultrasonic treatment in soap water, acetone, deionized water and isopropanol sequentially, and dried by using nitrogen gas. A layer of Ag NW film was then deposited onto the glass substrate by the blade coating. After that, a layer of clear glue was coated on the surface of Ag NW film. The sample was dried in an oven at 80° C. for several minutes. Finally, the flexible Ag NW-based TCE was easily peeled off from the glass substrate. The glass substrate can be reused. Figure 5a shows an area of 18×11 $cm^2$ ultra flexible Ag NW-based TCE with about 91% transmittance. It can be easily and reversibly bended by 180 degree without any damage, as shown in FIG. 5b. FIG. 6 compares the variation of the sheet resistance versus the number of bends for the flexible Ag NW-based TCE and a commercially available ITO-PET TCE. The sheet resistance of the Ag NW-based TCE remained essentially constant, while that of the commercial one dramatically increased by ≥100 folds. It further confirmed that our Ag NW-based TCE has excellent flexibility. This feature makes it suitable for wearable devices. The morphology of the Ag NW TCE was also observed by scanning electron microscope (SEM), as shown in the FIG. 6. From the SEM image, we can see that the Ag NW network is uniform and most of the Ag NWs were partially embedded in the polymer. The polymer can not only bind the NWs together, but also protect them from oxidation.

Example 4

Figure 8:
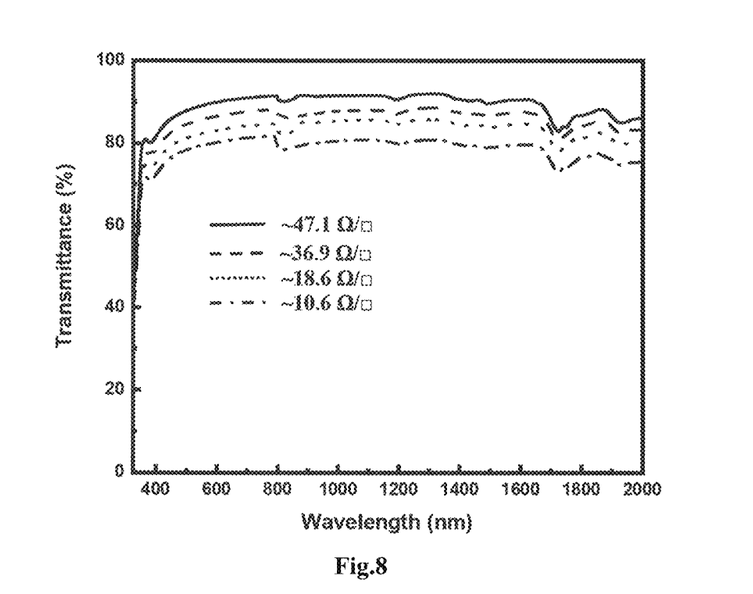
FIG. 8 presents optical transmittance of Ag NW films of different thickness.

In this example, the same conditions were used as example 3, but the gap between the blade and substrate was changed. By decreasing the gap from 40 to 10 µm, the transmittance of the films can be increased from ~78% to ~90%, as shown in FIG. 8.

Example 5

Compared to Example 3, the flexible Ag NW film in this example was prepared under the same conditions, but the polymer was changed to PMA.

Example 6

Figure 9:
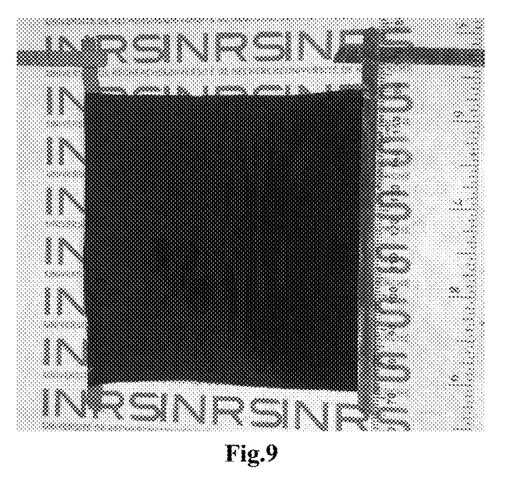
FIG. 9 presents optical photograph of the flexible light controlling device based on Ag NW TCE.

In this example, a SPD of about 9×9 cm² (as shown in FIG. 9) was assembled using blade coating to deposit an active layer with thickness of 60 μm between two flexible TCEs according to the typical procedure disclosed above. The transparent substrate 100, the Ag NW film 200, the polymeric matrix layer 300, the Ag NW film 400, and the transparent substrate layer 500 used are respectively urethane, Ag NW film (transmittance 91% and sheet resistance 50 Ω/sq, prepared in Example 3), siloxane polymer matrix containing suspended polyhalide-type LPP particles, Ag NW film (transmittance 91% and sheet resistance 50 Ω/sq, prepared in Example 3) and urethane.

Figure 10:
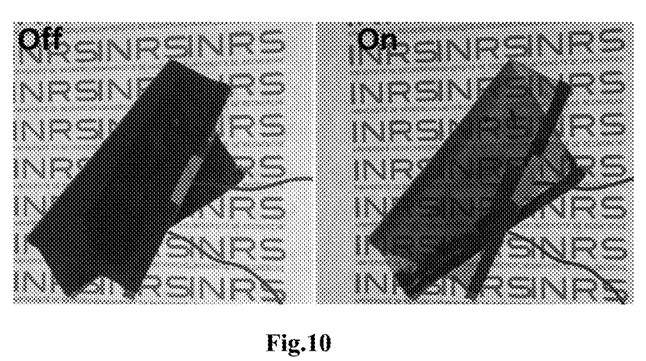

FIG. 10a presents the optical image of the as-prepared flexible SPD bended in 180° in the off state. Upon the application of an AC voltage, the device quickly becomes almost colorless, making the background clearly visible, as shown in FIG. 10b. The result shows that our Ag NW film TCE based SPD has excellent flexibility.

Example 7

Figure 11:
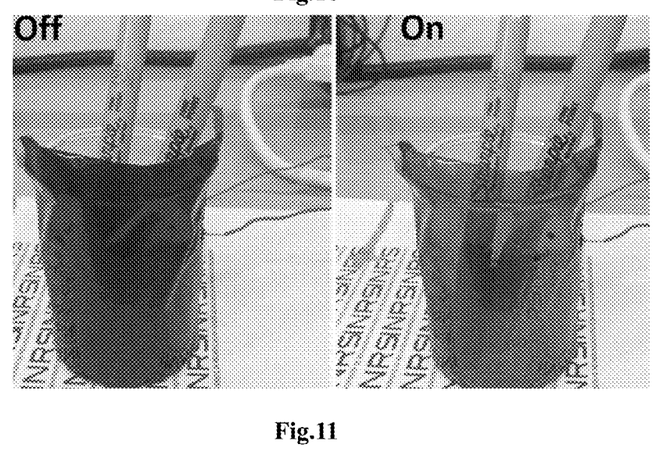

In this Example, the device prepared in Example 6 was placed on the surface of beaker. As shown in FIG. 11, with the AC voltage, the three-dimensional SPD becomes almost colorless and transparent, making the marker pen clearly visible.

Example 8

In this example, the SPD was fabricated under the same conditions as Example 6, but in a different configuration of Ag NW film 200/flexible and transparent substrate 100/polymeric matrix layer 300/flexible and transparent substrate 500/Ag NW film 400.

Example 9

In this example, the SPD was fabricated under the same conditions as Example 6, but the transmittance of the Ag NW film was reduced to 75%. The maximum optical modulation of the device was reduced to around 36%.

REFERENCE CITED

U.S. Patent Documents

US20100014150, Osamu Higashida et al. 2010
US20100047593, Osamu Higashida et al. 2010
U.S. Pat. No. 7,791,788, Steven M. Slovak et al. 2010
U.S. Pat. No. 6,900,923, Srinivasan Chakrapani et al. 2005
U.S. Pat. No. 8,520,294, Tooru Tanaka et al. 2013

Other Publications

Synthesis of Ag NWs, Hwansu Sim et at (Angew. Chem. 2016, 128, 11993).

What is claimed is:

1. A light transmission controlling device, comprising of: a first layer of a flexible and transparent substrate; a first layer of Ag NW film embedded into top of said first layer of said flexible and transparent substrate; a layer of polymeric matrix containing suspended particles on the top of said first layer of Ag NW film; a second layer of Ag NW film residing on said layer of polymeric matrix; a second layer of flexible and transparent substrate on said layer of second layer of Ag NW film, wherein the polymeric matrix contains multiple droplets and each droplet encapsulates multiple particles, and the material of the droplets is different from the material of the polymeric matrix, and the droplets are in a liquid form or at least a gel form within the polymer matrix; wherein the first layer of flexible and transparent substrate and the second layer of flexible and transparent substrate are the same, and the first layer of Ag NW film and the second layer of Ag NW film are the same, so the light transmission controlling device is symmetric in structure.

2. The light transmission controlling device as recited in claim 1, wherein said first layer of Ag NW film is formed from a Ag NW film.

3. The light transmission controlling device as recited in claim 1, wherein said second layer of Ag NW film is formed from a Ag NW film.

4. The light transmission controlling device as recited in claim 1, wherein said first layer of flexible transparent substrate is a PMMA film.

5. The light transmission controlling device as recited in claim 1, wherein said first layer of flexible and transparent substrate is urethane film.

6. The light transmission controlling device as recited in claim 1, wherein said second layer of flexible and transparent substrate is a PMMA film.

7. The light transmission controlling device as recited in claim 1, wherein said second layer of flexible and transparent substrate is urethane film.

8. The light transmission controlling device as recited in claim 1, wherein said first layer of Ag NW film has a transmittance from 75%-95%.

9. The light transmission controlling device as recited in claim 1, wherein said second layer of Ag NW film has a transmittance from 75%-95%.

10. The light transmission controlling device as recited in claim 1, wherein said first layer of Ag NW film has a sheet resistance from 1 to 500 Ω/sq.

11. The light transmission controlling device as recited in claim 1, wherein said second layer of Ag NW film has a sheet resistance from 1 to 500 Ω/sq.

12. The light transmission controlling device as recited in claim 1, wherein said first layer of Ag NW film has a thickness of 20 nm to 300 nm.

13. The light transmission controlling device as recited in claim 1, wherein said second layer of Ag NW film has a thickness of 20 nm to 300 nm.

14. The light transmission controlling device as recited in claim 1, wherein said layer of polymeric matrix has a thickness between 20 μm and 2001 μm.

15. The light transmission controlling device as recited in claim 1, wherein said layer of polymeric matrix is a cross-linked polysiloxane.

16. The light transmission controlling device as recited in claim 1, wherein said suspended particles contained inside said layer of polymeric matrix are polyhalides.

17. A method to prepare the said first layer of a flexible and transparent substrate and the said first layer of Ag NW film embedded into top of said first layer of said flexible and transparent substrate of claim 1, comprises the steps
    (a) forming a thin layer of Ag NWs on a rigid substrate,
    (b) forming a transparent polymer on top of the thin layer of Ag NWs and constituting a layer of Ag NWs embedded transparent polymer, and
    (c) pulling off the said layer of Ag NWs embedded transparent polymer from the said rigid substrate.

18. A method to prepare the said second layer of a flexible and transparent substrate and the said second layer of Ag NW film embedded into top of said second layer of said flexible and transparent substrate of claim 1 comprises the steps
- (a) forming a thin layer of Ag NWs on a rigid substrate,
- (b) forming a transparent polymer on top of the thin layer of Ag NWs and constituting a layer of Ag NWs embedded transparent polymer, and
- (c) pulling off the said layer of Ag NWs embedded transparent polymer from the said rigid substrate.

* * * * *